(12) United States Patent
Hill

(10) Patent No.: US 6,298,452 B1
(45) Date of Patent: Oct. 2, 2001

(54) HARDWARE TEST COVERAGE USING INTER-CHIP EVENT FILTERING IN MULTI-CHIP SIMULATIONS

(75) Inventor: Eric L. Hill, San Francisco, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/244,872

(22) Filed: Feb. 5, 1999

(51) Int. Cl.[7] .............................. G06F 9/455; G06F 17/50; G06F 11/00
(52) U.S. Cl. ................................... 714/28; 714/33; 716/4; 703/14
(58) Field of Search ............................ 714/28, 33, 25, 714/30, 734; 703/23, 28, 13–15, 21; 716/1, 4, 16; 712/32, 36

(56) References Cited

U.S. PATENT DOCUMENTS

| 5,546,562 | * | 8/1996 | Patel . |
| 5,838,948 | * | 11/1998 | Bunza . |
| 6,006,022 | * | 12/1999 | Rhim et al. . |
| 6,009,256 | * | 12/1999 | Tseng et al. . |
| 6,152,612 | * | 11/2000 | Liao et al. . |

* cited by examiner

Primary Examiner—Gopal C. Ray

(57) ABSTRACT

A simulator simulates and verifies inter-chip functionality in a multi-chip computer system model. The chips within the multi-chip computer system model are characterized by a combination of detailed, low-level hardware models and generalized, high-level hardware emulators. As the simulator executes, inter-chip events are generated which are caused by interactions among and between the hardware models and the hardware emulators. An event processor processes events generated by the simulator, writing events to an event log file. An inter-chip event detector processes the event log file, filtering out inter-chip events caused by the hardware emulators, logging inter-chip events caused by the hardware models. Isolating inter-chip events caused by hardware models helps verification engineers direct the limited number of simulation cycles available during multi-chip verification, thus increasing the confidence level that the multi-chip computer system design is correct.

12 Claims, 5 Drawing Sheets

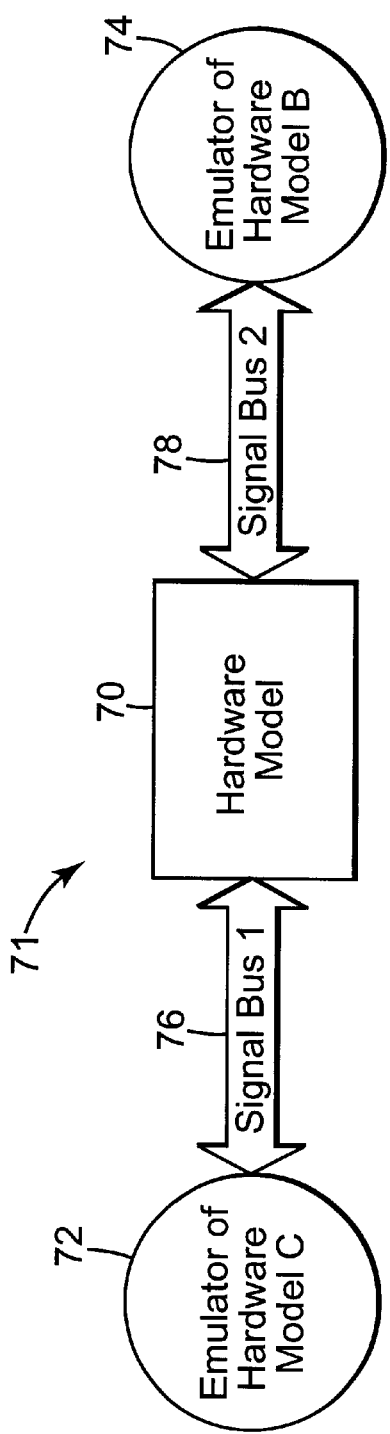
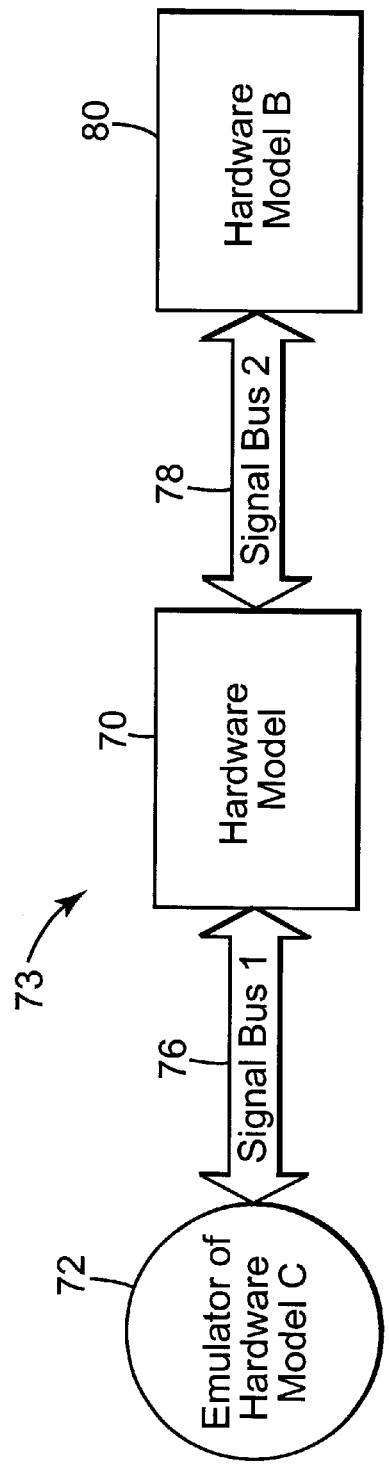

HARDWARE TEST COVERAGE USING INTER-CHIP EVENT FILTERING IN MULTI-CHIP SIMULATIONS

THE FIELD OF THE INVENTION

The present invention relates generally to simulation and functional testing of integrated circuit chips and multi-chip systems, such as computer systems, and, more particularly to test coverage of hardware model interfaces using inter-chip event filtering in multi-chip system simulations.

BACKGROUND OF THE INVENTION

Inter-chip software simulation is increasingly utilized in the development of multi-chip systems in order to verify inter-chip functionality. The multi-chip system development process can lead to inter-chip malfunctions for a variety of reasons. For example, interfaces between integrated circuit chips, such as very large scale integration (VLSI) chips, are often ambiguously documented or missing important descriptions required for correct implementation. Design engineers often concentrate on the internal operational characteristics of integrated circuit chips during the design and verification process at the expense of inter-chip functionality. In many instances, the design of integrated circuit chips for multi-chip products occurs across widely dispersed, geographically isolated locations which often leads to design isolation.

The need for inter-chip software simulation also results because system integration typically comes much later in the design cycle, after the integrated circuit chips have been fabricated into hardware. The system integration phase can take months as chips are debugged and prototyped. Only upon integration is the system addressed in its totality. Thus, many serious design problems typically occur and are debugged during system integration. Moreover, by the time the system integration occurs, system designers who have overall system knowledge are often moved on to other projects.

Furthermore, chip-to-chip interfacing bugs are typically very expensive to fix after actual hardware has been fabricated. For example, one or more chips may need to be redesigned and reprocessed which can be very costly. Moreover, product shipment dates can slip, potentially costing even greater additional dollars in lost revenue. Thus, there is a desire to identify inter-chip bugs before fabricating the chips.

Unfortunately, inter-chip software simulations are often considerably more complex than software simulations of a single chip. In fact, inter-chip software simulations may execute an order of magnitude slower than a single chip software simulation. This performance problem dictates that the design engineer cannot rely on traditional random test generation verification process, which takes many simulation cycles.

In some instances, hardware has been employed to speed up the simulation/verification process. Hardware simulation and verification tools, such as QUICKTURN, commercially available from Quicktum Design Systems Inc., allow design engineers to model their chip designs quickly in hardware, enabling the design engineers to pinpoint flaws and correct the flaws on the spot. These hardware simulation and verification tools execute much faster than their software counterparts. However, while hardware simulators are acceptable for relatively simple, single chips with about a million transistors, hardware simulators are too costly and complex for multi-chip systems, such as computer systems, which can have over 40 chips averaging over 2 million transistors each.

In order to address the performance problems encountered when performing software simulations of large multi-chip systems, simulations are now performed by a combination of hardware models and hardware emulators. A hardware model is a detailed program that is written in a hardware description language such as Verilog or VHDL. This hardware model program is synthesized and converted, and finally one or more VLSI chips are fabricated based on the synthesized and converted program. Hardware models are verified by running the program on a computer with a hardware description language simulator.

A hardware emulator is a program used to verify a hardware model. A hardware emulator is written in any number of programming languages, such as C, C++, and PASCAL, and can be written in a hardware description language, such as Verilog or VHDL. Hardware emulators drive stimuli into hardware models and perform the proper handshaking protocols to communicate with a hardware model. Unlike hardware models, hardware emulators typically do not model all of the low-level details of hardware, in other words, hardware emulators tend to be more behavioral. For example, hardware emulators do not typically model exact timing functionality of the hardware. Also, unlike hardware models, hardware emulators are never synthesized and processed into VLSI chips. Finally, hardware emulators typically run significantly faster than hardware models within simulations. Thus, multi-chip simulations utilize some combination of high complexity hardware models and low complexity hardware emulators in order to verify inter-chip functionality in a reasonable amount of time.

An event is a trigger within a hardware model that fires when a particular sequence of interactions occurs. Examples of typical events include: filling a queue; reaching a certain state in a state machine; and asserting a specific signal or group of signals. Events provide indications of the internal operation of the hardware model, and provide coverage information indicative of which portions of the multi-chip system have been verified.

In a multi-chip functional simulation verification framework, better quality silicon is obtained by improving coverage using inter-chip events. An inter-chip event is a trigger within an interface block of a chip. Inter-chip events are generated within an interface block of a chip by stimuli from one or more adjacent hardware models or hardware emulators.

One problem encountered by verification engineers performing conventional multi-chip simulations which employ hardware models and hardware emulators is that inter-chip events caused by hardware emulators are not distinguished from inter-chip events caused by hardware models. Inter-chip events caused by hardware models are much more meaningful to verification engineers than inter-chip events caused by hardware emulators. Hardware models are used to directly generate the actual corresponding hardware, and contain exact timing and functionality of the corresponding hardware. Since hardware emulators do not contain such exact timing and functionality of the hardware, inter-chip events generated by hardware emulators are often artificial cases which never occur in the actual system.

Prior solutions for coverage in multi-chip simulation environments do not determine if inter-chip events are caused by hardware models or hardware emulators. Thus, inter-chip events detected by these prior systems are less meaningful for reasons stated above. In other words, verification engineers are not certain that any actual chip-to-chip events have occurred. Instead, the verification engineer only knows that either chip-to-chip events or emulator-to-chip events have occurred. As a result, prior solutions do not allow verification engineers to reliably measure inter-chip functionality.

Therefore, there is a need for an improved multi-chip software simulation system which is able to distinguish hardware model caused inter-chip events from hardware emulator caused inter-chip events.

SUMMARY OF THE INVENTION

The present invention provides an apparatus for verifying inter-chip functionality in a multi-chip computer system having multiple integrated circuit chips. The apparatus includes a multi-chip computer system model which includes a plurality of hardware models, where each hardware model is a relatively low-level software characterization of a corresponding integrated chip. The hardware model is later synthesized and processed to form the corresponding integrated circuit chip. The multi-chip computer system model also includes a plurality of hardware emulators, where each hardware emulator is a relatively high-level software characterization of a corresponding integrated circuit chip. The hardware emulator is not capable of being synthesized and processed to form the corresponding integrated circuit chip. A simulator is also included within the apparatus of the present invention which generates a plurality of events during execution, including inter-chip events. Inter-chip events are defined as events that are caused by interactions among and between the hardware models and hardware emulators. The apparatus of the present invention further include an events log file, and an event processor for processing events generated by the simulator, such that the event processor records events in the events log file. Finally, the apparatus of the present invention includes an inter-chip event detector. The inter-chip event detector processes the events log file, and filters out inter-chip events caused by the hardware emulators and logs inter-chip events caused by the hardware models.

In the apparatus described above, the hardware models execute relatively slowly during the verification process, while the hardware emulators execute relatively quickly during the verification process. In one embodiment, the simulator employed is a hardware description language (HDL) simulator. The inter-chip event detector accepts as input a file including a topology of the hardware models and hardware emulators that exist within the multi-chip computer system.

The present invention also provides a method for verifying inter-chip functionality in a multi-chip computer system, where the computer system has multiple integrated circuit chips. The method begins by defining a plurality of hardware models. Each hardware model is a relatively low-level software characterization of a corresponding computer chip, where the hardware model is synthesized and processed to form the corresponding computer chip.

After the plurality of hardware models has been defined, the method next defines a plurality of hardware emulators. Each hardware emulator is a relatively high-level software characterization of a corresponding computer chip which is not capable of being synthesized and processed to form the corresponding computer chip. After the plurality of hardware models and the plurality of hardware emulators have been defined, a multi-chip computer system model is constructed from a combination of hardware models and hardware emulators.

Next, the multi-chip computer system model is simulated with a simulator. The simulator generates a plurality of events during execution, including inter-chip events. Inter-chip events are defined as events that are caused by interactions among and between the hardware models and hardware emulators. An event processor then processes the plurality of events generated by the simulator, and writes the plurality of events to an events log file.

Finally, an inter-chip detector parses the events log file generated by the event processor. The inter-chip detector filters out inter-chip events caused by the hardware emulators and logs inter-chip events caused by the hardware models.

In the method described above, the hardware models execute relatively slowly during the verification process, while the hardware emulators execute relatively quickly during the verification process. The inter-chip event detector accepts as input a file including a topology of the hardware models and hardware emulators that exist within the multi-chip computer system. In one embodiment, the simulator employed within the method is a hardware description language (HDL) simulator.

The present invention enhances the quality and performance of inter-chip functional simulations by providing an improved multi-chip software simulation system which distinguishes hardware model caused inter-chip events from hardware emulator caused inter-chip events. By filtering out hardware emulator generated inter-chip events, a verification engineer is left with inter-chip events that are generated only by the highly accurate and detailed hardware models which precisely model the hardware that will eventually be built.

BRIEF DESCRIPTION OF THE DRAWINGS

FIG. 3 illustrates a first example topology having a hardware model connected to two hardware emulators via two signal busses in accordance with the present invention.

FIG. 4 illustrates a second example topology wherein one hardware model is connected to a hardware emulator and a hardware model, in accordance with the present invention.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
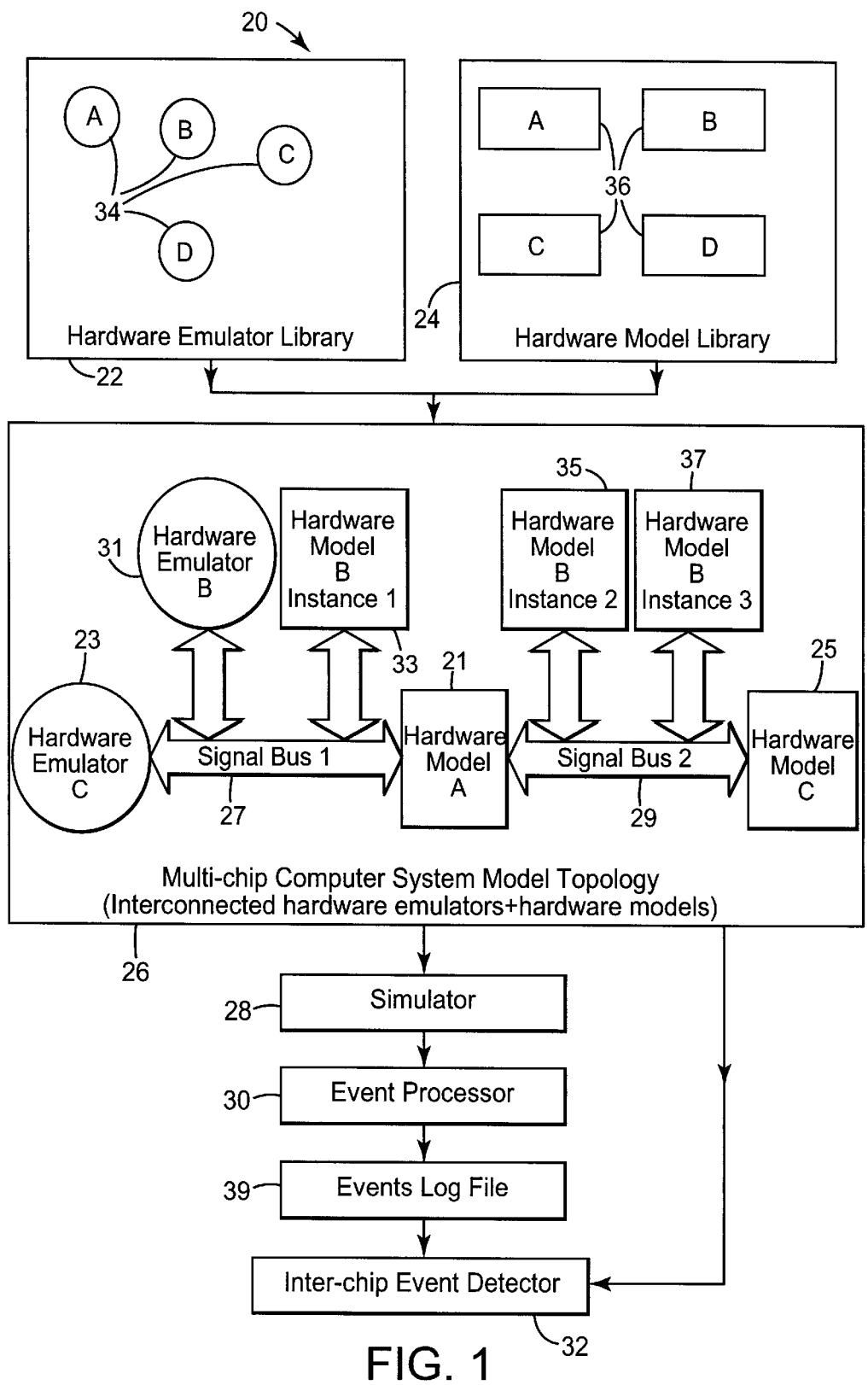
FIG. 1 is a structural block diagram illustrating a multi-chip simulation/verification environment in accordance with the present invention.

FIG. 1 illustrates in structural block diagram form a multi-chip simulation/verification environment 20 in accordance with the present invention for simulating a multi-chip computer system. Multi-chip simulation environment 20 includes: a hardware emulator library 22 containing a plurality of hardware emulators 34; a hardware model library 24 containing a plurality of hardware models 36; a multi-chip computer system model 26 constructed from selected hardware models 36 and selected hardware emulators 34; a simulator 28 for simulating and verifying multi-chip computer system model 26; an event processor 30 for processing events generated by simulator 28; an events log file 39 generated by event processor 30; and an inter-chip event detector 32.

Hardware model library 24 includes a collection of individual hardware models 34. Each hardware model 36 is a program that is written in a hardware description language, such as Verilog or VHDL. Hardware model 36 is synthesized, converted, and finally one or more VLSI chips are fabricated based on the synthesized and converted program.

Hardware emulator library 22 includes a collection of individual hardware emulators 34. Each hardware emulator 34 is a program used to verify a hardware model 36. Hardware emulator 34 can be written in a number of programming languages, including, but not limited to, C, C++, and Pascal. Hardware emulator 34 can also be written in a hardware description language, such as Verilog or VHDL. Hardware emulators 34 drive stimuli into hardware models 36 and perform the proper handshaking protocols to communicate with hardware model 36.

There are several significant differences between hardware emulators 34 and hardware models 36. Hardware emulators 34 are relatively high-level, low-complexity behavioral descriptions of an associated chip, while hardware models 36 are relatively low-level, highly-detailed descriptions of an associated chip. Hardware emulators 34 are not synthesized and processed into VLSI chips, while hardware models 36 are synthesized and processed into VSLI chips. Finally, hardware emulators 34 run much faster than hardware models 36 within simulations, as a result of their reduced complexity.

Multi-chip computer system model 26 includes a combination of interconnected hardware emulators 34 and hardware models 36. In the illustrated embodiment of multi-chip computer system model 26, hardware model "A" 21 is connected to hardware emulator "C" 23 and hardware model "C" via signal bus 27 and signal bus 29, respectively. Hardware emulator "B" 31 and hardware model "B" 33 are also connected to signal bus 27, while hardware model "B" 35 and hardware model "B" 37 are also connected to signal bus 29.

Multi-chip computer system model 26 is simulated and verified by simulator 28. Simulator 28 can be a hardware description language simulator. In one embodiment, the hardware description language simulator employed within this invention is Verilog. Simulator 28 generates a plurality of events during the simulation/verification process. Events are triggers within hardware models 36 that fire when a particular sequence of interactions occur. Event processor 30 processes the triggered events, and writes the triggered events to an events log file 39. In one embodiment, event processor 30 is implemented with one or more "if" (evaluation) statements followed by a "print" statement which logs a unique identifier of the event and the time the event occurred. Examples of typical events triggered during simulation include: filling up a queue; reaching a certain state in a state machine; or asserting a specific group of signals. Events provide verification engineers with information related to the internal operation of hardware model 36, and provide coverage information related to which portions of hardware model 36 and its interfaces have been verified.

Inter-chip event detector 32 further classifies events from events log file 39 into intra-chip events and inter-chip events. An inter-chip event is a trigger within an interface block of a chip. The inter-chip event triggers every time a specific case occurs within the interface block of the chip's hardware model. Event processor 30 logs each inter-chip event's unique identifier each time it occurs.

Inter-chip events within hardware model 36 can be generated by other adjacent hardware models 36 or adjacent hardware emulators 34. In order for the simulation/verification coverage to be meaningful, each inter-chip event must be caused by an adjacent hardware model 36 and not by an adjacent hardware emulator 34. Hardware emulators 34 do not model the exact timing and functionality of the hardware model 36. Therefore, inter-chip events caused by hardware emulators 34 are often artificial cases which never occur in the actual multi-chip computer system.

Inter-chip event detector 32 first analyzes events from events log file 39 to separate intra-chip events from inter-chip events. Once inter-chip events have been separated, inter-chip event detector 32 next separates the inter-chip events into inter-chip events generated by an adjacent hardware emulator, and inter-chip events generated by a hardware model. Next, inter-chip event detector 32 filters out inter-chip events caused by hardware emulators 34 while logging inter-chip events caused by hardware models 36. Hereinafter, inter-chip events caused within a first hardware model by an adjacent hardware model will be referred to as "interesting" inter-chip events.

Figure 2:
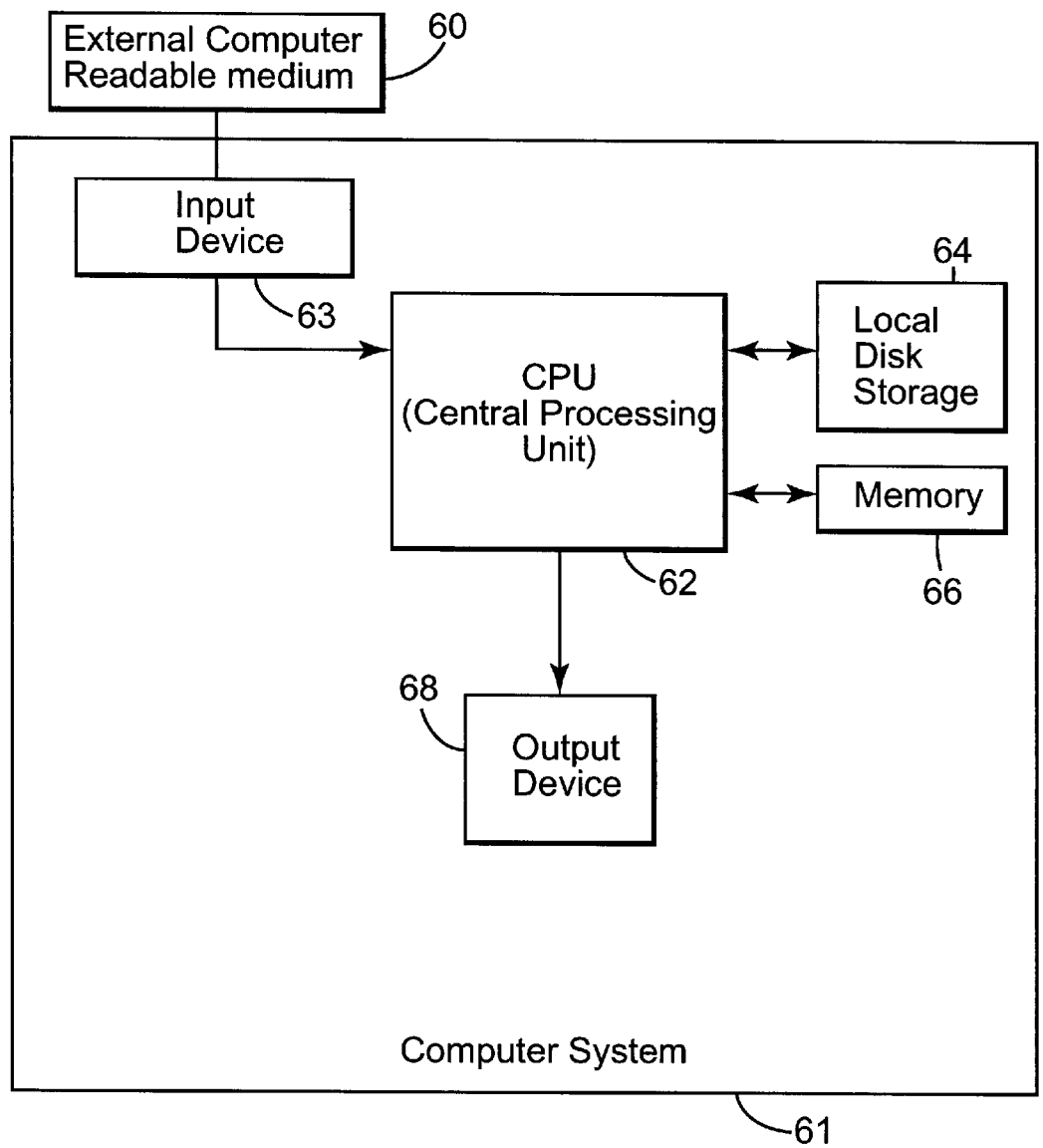
FIG. 2 is an illustration of a computer readable medium incorporating the inter-chip event detector computer program in accordance with the present invention.

FIG. 2 illustrates in block diagram form a computer system 61 and an external computer readable medium 60 incorporating inter-chip event detector 32 in accordance with the present invention. Embodiments of external computer readable medium 60 include but are not limited to: a CD-ROM; a floppy disk; and a disk cartridge. Inter-chip event detector 32 can be implemented in a variety of compiled and interpreted computer languages. In a preferred embodiment, inter-chip event detector 32 is written in PERL. External computer readable medium 60 stores source code, object code, executable code, shell scripts and/or dynamic link libraries for inter-chip event detector 32. An input device 63 reads data from external computer readable medium 60 and provides this data to computer system 61. Embodiments of input device 63 include but are not limited to: a CD-ROM reader; a floppy disk drive; and a data cartridge reader.

Computer system 61 includes a central processing unit 63 for executing the inter-chip event detector 32. Computer system 61 also includes local disk storage 64 for locally storing inter-chip event detector 32 before, during and after execution. Inter-chip event detector 32 also utilizes memory 66 within computer system 61 during execution. Upon execution of inter-chip event detector 32, output data is produced and directed to output device 68. Embodiments of output device 68 include but are not limited to: a computer display device; a printer; and/or a disk storage device.

FIG. 3 illustrates a first example topology 71 having a hardware model 70 connected to a hardware emulator 72 and a hardware emulator 74 via signal busses 76 and 78, respectively. In this illustrative embodiment, hardware model 70 does not communicate directly with any other hardware models. If topology 71 is employed in multi-chip computer system model 26 of FIG. 1, inter-chip event detector 32 filters out all events from topology 71, because there are no inter-chip events caused within a first hardware model by an adjacent hardware model (i.e., "interesting" inter-chip events).

FIG. 4 illustrates a second example topology 73 having a hardware model 70 connected to hardware emulator 72 and hardware model 80. In this illustrative embodiment, "interesting" events can occur, since there are two adjacent hardware models 70 and 80 interconnected by signal bus 78. In other words, hardware model 70 can have inter-chip events caused by hardware model 80, and hardware model 80 can have inter-chip events caused by hardware model 70. The inter-chip event filtering process of inter-chip event detector 32 passes all events hit in hardware model 70 and tags these events as being caused by hardware model 80, then logs the results. Similarly, the inter-chip event filtering process of inter-chip event detector passes all events hit within hardware model 80, tags these events as being caused by hardware model 72, then logs the results. Events in hardware model 70 caused by hardware emulator 72 are not logged by inter-chip event detector 32, because such events are generated by a hardware emulator rather than a hardware model.

Figure 5:
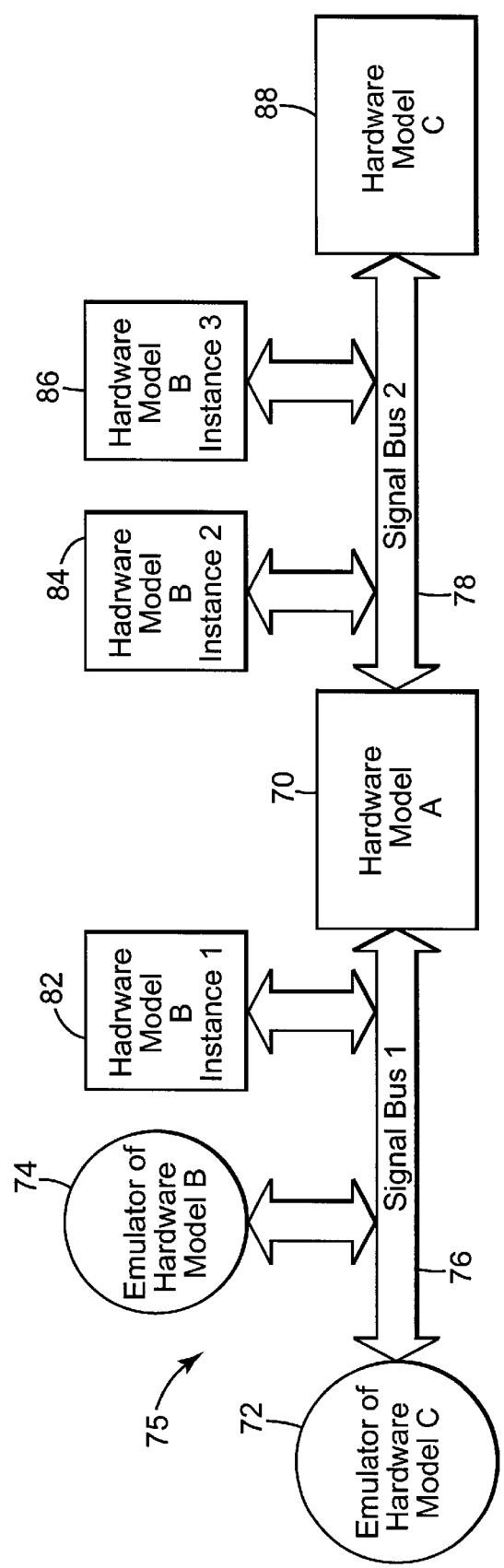
FIG. 5 illustrates a third example topology having three unique hardware models and two hardware emulators, in accordance with the present invention.

FIG. 5 illustrates a third example topology 75 having five unique hardware models 70, 82, 84, 86, and 88 and two hardware emulators 72 and 74. Hardware models 82, 84 and 86 are three separate model instances of the same type of hardware model B (i.e., instances 1, 2 and 3).

In this illustrative example, no "interesting" inter-chip events can be caused within hardware model 70 by any adjacent hardware models 82 or emulators 72 and 74 interconnected to hardware model 70 by signal bus 76. Hardware emulator 72 cannot cause any interesting inter-chip events within hardware model 70 because it is an emulator. Hardware model type B exists on signal bus 76 as both hardware emulator 74 and hardware model 82. In this case, it is difficult to discern which events are caused by hardware emulator 74 versus hardware model 82 (since both the hardware model and the hardware emulator represent the same component type B). Thus, all inter-chip events caused by hardware emulator 74 and hardware model 82 within hardware model 70 are filtered out (i.e., not logged). This guarantees that no false reporting of "interesting" inter-chip events occur. When considering inter-chip events caused within hardware model 82 on signal bus 76, only hardware model 70 causes "interesting" events.

Also in this illustrative example, there are "interesting" inter-chip events caused within hardware model 70 by hardware model 88 and hardware models 84 and 86 interconnected to hardware model 70 by signal bus 78. However, since hardware model 84 and hardware model 86 are two instances of the same hardware model type B, and cannot be uniquely identified by inter-chip event detector 32, "interesting" inter-chip events are logged that are caused by any hardware model which does not have a corresponding hardware emulator representing the same component type on the same signal bus or does not have another instance of the same hardware model type on the same signal bus.

There are also "interesting" inter-chip events caused within hardware model 88 by other hardware models 70, 84 and 86 interconnected to hardware model 88 by signal bus 78. However, since hardware model 84 and hardware model 86 are two instances of the same hardware model type B, and cannot be uniquely identified by inter-chip event detector 32, "interesting" inter-chip events are logged that are caused by any hardware model which does not have a corresponding hardware emulator representing the same component type on the same signal bus or does not have another instance of the same hardware model type on the same signal bus.

In the case of hardware model 84, "interesting" inter-chip events are caused within this hardware model by hardware model 70, hardware model 86 and hardware model 88. Similarly, in the case of hardware model 86, "interesting" inter-chip events are caused within this hardware model by hardware model 70, hardware model 84, and hardware model 88. The following Table I summarizes "interesting" inter-chip events detected within each of the hardware models of the current example.

TABLE I

| Name of Hardware Model | Tagged as Caused by |
|---|---|
| Hardware Model B Instance 1 (82) events | A |
| Hardware Model B Instance 2 (84) events | A, B, and C |
| Hardware Model B Instance 3 (86) events | A, B, and C |
| Hardware Model C (88) events | A and B |
| Hardware Model A (70) signal bus (76) events | none |
| Hardware Model A (70) signal bus (78) events | B and C |

Figure 6:
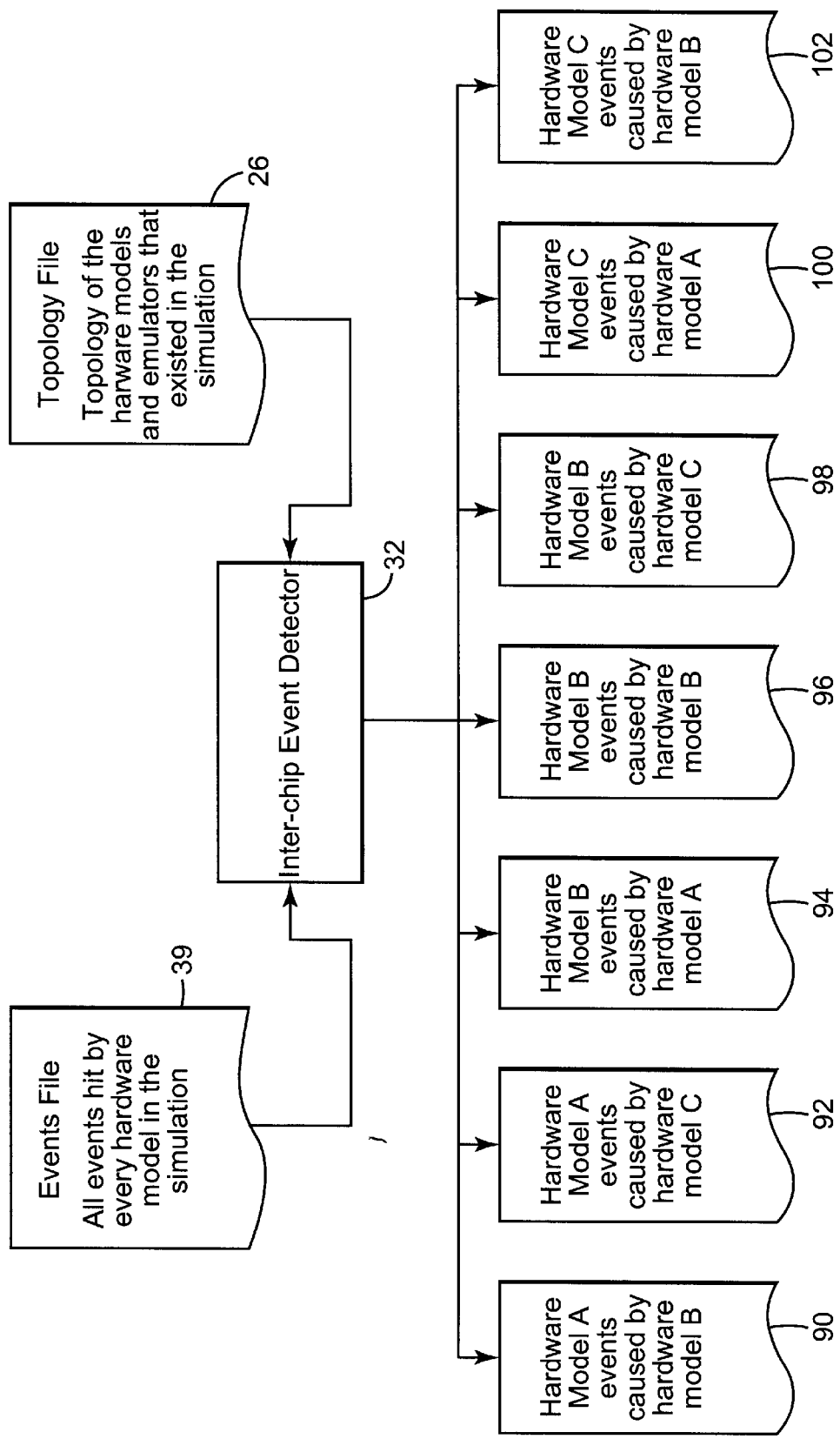
FIG. 6 is a simplified block diagram of the inter-chip event filter program of the present invention, and its associated inputs and outputs.

FIG. 6 is a simplified block diagram illustrating example inputs and outputs of inter-chip event detector 32 of the present invention. Inter-chip event detector 32 reads input events log file 39 and a topology file 126. Input events log file 39 includes all events hit within all hardware models in a multi-chip simulation performed by simulator 28. Input topology file 126 represents the topology of multi-chip computer system model 26. The illustrated example of FIG. 6 assumes that multi-chip computer system model 26 is configured in the topology 75 illustrated in FIG. 5.

Inter-chip event detector 32 processes each entry in events log file 39, and tags those events which are generated by an adjacent hardware model. In some instances, there may be two or more adjacent hardware models on the same bus at the time at which the inter-chip event occurs. Inter-chip event detector 32 can only determine and report which hardware models were on the bus at the time an inter-chip event occurs. In many instances, this information is adequate for a verification engineer. However, in some instances, a verification engineer needs to isolate the cause of the inter-chip event to a specific hardware model. Thus, further analysis may be required in order to determine which one of the two or more adjacent hardware models actually caused the inter-chip event.

There are several different approaches to determine which one of the two or more adjacent hardware models actually caused the inter-chip event. In a first approach, the inter-chip event type is directly correlated to the hardware model that caused the event. In one preferred embodiment, the event-type/hardware model correlation is done through an automated look-up table. As an example, an inter-chip event of type "IO" occurring within hardware model "C" occurs when adjacent models A and B are on the bus. Adjacent model A is a memory controller, and adjacent model B is an I/O controller. It is known that events of type "IO" can only be generated by the I/O controller (hardware model B), thus it is determined that event "IO" is caused by hardware model B.

In a second approach, pair-wise simulation is used to isolate the hardware model that caused the inter-chip event.

As an example, an inter-chip event of type "XYZ" occurs within hardware model "C" when adjacent hardware models A and B are on the bus. Adjacent hardware model A is a memory controller, and adjacent hardware model B is an I/O controller. Inter-chip event type "XYZ" cannot be directly correlated to either hardware model A or hardware model B, as described in the preceding paragraph. Thus, a new approach is needed to isolate the hardware model that caused the inter-chip event. In order to isolate the causation of the inter-chip event to a specific hardware model, each of the hardware models that potentially cause the inter-chip event "XYZ" are isolated into a new, pair-wise topologies. The verification engineer manually creates the new pair-wise topologies required for these simulations. In this example, two new pair-wise topologies are created and simulated: a first pair-wise simulation is performed on a first pair-wise topology including hardware model C and adjacent hardware model A, and a second pair-wise simulation is performed on a topology including hardware model C and adjacent hardware model B. These two additional pair-wise simulations serve to isolate which of adjacent hardware models is the cause of the inter-chip event.

In rare instances, inter-chip events may occur only when two or more adjacent hardware models/hardware emulators are on the bus simultaneously. Thus, there may be isolated cases where neither of the two approaches described above will be able to effectively isolate the causation of the inter-chip event. In these isolated instances, a third approach is available to identify this occurrence. Under this third approach, a verification engineer manually traces the simulation results in order to detect and identify the cause of the inter-chip event.

After inter-chip event detector 32 determines which adjacent hardware model causes the inter-chip event, inter-chip event detector 32 creates one file for each possible inter-chip combination and logs events with tags in appropriate files, as indicated at 90, 92, 94, 96, 98, 100, and 102. As an example, log file 92 includes hardware model 70 events caused by adjacent hardware model 88. Log files 90, 92, 94, 96, 98, 100, and 102 enable a verification engineer to reliably ascertain inter-chip functionality by reviewing the events that have occurred for any multi-chip simulation.

The following pseudo code segment listing "A" is a generalized representation of one software program implementation for inter-chip event detector 32 of the present invention.

Pseudo Code Segment A

```
For each (hardware model in multi-chip computer system)
{
    For each (inter-chip event detected in this hardware model)
    {
        If (inter-chip event detected is generated by an
            external hardware model)
        {
            log I/O event to file of hardware model having events
            generated by this particular external hardware model
        }
        else
        {
            filter out events generated by an external hardware
            emulator
        }
    }
}
```

The above pseudo code segment A begins by looping through each hardware model in the multi-chip computer system model 26. For each hardware model, a second loop processes each inter-chip event detected. If the current inter-chip event detected within the current hardware model is generated by an external hardware model, the event is logged to a file containing events for this current hardware model/external hardware model combination. However, if the current inter-chip event detected within the current hardware model is not generated by an external hardware model, the event is filtered out.

The following pseudo code segment listings "B", "C", "D" and "E" are more specific representations of one software program implementation for inter-chip event detector 32, wherein the software program is specifically tailored to interact with topology 75 illustrated in FIG. 5.

Pseudo Code Segment B

```
For each (hardware model C)
{
    For each (event hit in this hardware model C)
    {
        If (A is a hardware model)
        {
            log event to file of hardware model C events hit by A
        }
        If (All B models on this bus are hardware models)
        {
            log event to file of hardware model C events hit by B
        }
    }
}
```

Pseudo code segment "B" processes events generated within hardware model 88. Pseudo code segment "B" begins by looping through each occurrence of hardware model 88 within multi-chip computer system model 26. Within each instance of hardware model 88, a second loop processes each inter-chip event detected. A series of conditional processing (e.g. "if") statements are then executed to determine if the inter-chip event is generated by an adjacent hardware model, and if so, the event is logged to the proper log file.

The following pseudo code segment "C" processes events generated within hardware models 82, 84 and 86.

Pseudo Code Segment C

```
For each (hardware model B)
{
    For each (event hit in this hardware model B)
    {
        If (A is a hardware model)
        {
            log event to file of hardware model B events hit by A
        }
        If (two or more B models exist on this bus) and (all B models on
            the bus are hardware models)
        {
            log event to file of hardware model B events hit by B
        }
        If (C is a hardware model)
        {
            log event to file of hardware model B events hit by C
        }
    }
}
```

Pseudo code segment C begins by looping through each hardware model 82, 84 and 86 within the multi-chip computer system model 26. Within each hardware model, a second loop processes each inter-chip event detected. A series of conditional processing (e.g. "if") statements are then executed to determine if the inter-chip event is generated by an adjacent hardware model, and if so, the event is logged to the proper log file.

The following pseudo code segment "D" processes events generated within hardware model 70.

Pseudo Code Segment D

```
For each (hardware model A)
{
   For each (event hit in this hardware model A)
   {
      If (all B models on bus 1 are hardware models) and
        (event involves interface functionality for bus 1)
      {
         log event to file of hardware model A events hit by B
      }
      If (all B models on bus 2 are hardware models) and
        (event involves interface functionality for bus 2)
      {
         log event to file of hardware model A events hit by B
      }
      If (C on bus 1 is a hardware model) and
        (event involves interface functionality for bus 1)
      {
         log event to file of hardware model A events hit by C
      }
      If (C on bus 2 is a hardware model) and
        (event involves interface functionality for bus 2)
      {
         log event to file of hardware model A events hit by C
      }
   }
}
```

Pseudo code segment "D" begins by looping through each occurrence of hardware model 70 within the multi-chip computer system model 26. Within each instance of hardware model 70, a second loop processes each inter-chip event detected. A series of conditional processing (e.g. "if") statements are then executed to determine if the inter-chip event is generated by an adjacent hardware model, and if so, the event is logged to the proper log file.

The following pseudo code segment "E" creates a numerical summary of the inter-chip events logged to the event log files.

Pseudo Code Segment E

```
{
   x = numerical encoding for hardware model that the event occurred in
   y = numerical encoding for hardware model which caused this event
   For each (event)
   {
      Increment database entry (x,y)
   }
}
```

Pseudo code segment "E" begins by opening the database of events. The database of events is a two-dimensional array of cells (X,Y), where the "X" dimension is a numerical encoding representing the hardware model in which the event occurred, and the "Y" dimension is a numerical encoding representing the hardware model which caused the event. In this manner, each event log file has a corresponding cell location in the two-dimensional array of cells. As each log file is processed, a counter is incremented in the corresponding cell location in the two-dimensional array of cells for each event logged in the log file. In this manner, a numerical summary is generated in the two-dimensional array of cells representing the number of events present within each event log file.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the electrical and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An apparatus for verifying inter-chip functionality in a multi-chip computer system having multiple integrated circuit chips, comprising:

a multi-chip computer system model including:

a plurality of hardware models, wherein each hardware model is a relatively low-level software characterization of a corresponding integrated circuit chip, and wherein the hardware model is synthesized and processed to form the corresponding integrated circuit chip; and a plurality of hardware emulators, wherein each hardware emulator is a relatively high-level software characterization of a corresponding integrated circuit chip, and wherein the hardware emulator is not capable of being synthesized and processed to form the corresponding integrated circuit chip;

a simulator for simulating the multi-chip computer system model, wherein the simulator generates a plurality of events during execution, including inter-chip events, wherein inter-chip events are defined as events that are caused by interactions among and between the hardware models and hardware emulators;

an events log file;

an event processor for processing events generated by the simulator, wherein the event processor records events in the events log file; and an inter-chip event detector which processes the events log file, filters out inter-chip events caused by the hardware emulators and logs inter-chip events caused by the hardware models.

2. The apparatus of claim 1, wherein the hardware models execute relatively slowly during the verification process, and the hardware emulators execute relatively quickly during the verification process.

3. The apparatus of claim 1, wherein the simulator is a hardware description language (HDL) simulator.

4. The apparatus of claim 1, wherein the inter-chip event detector accepts as input a file including a topology of the hardware models and hardware emulators that exist within the multi-chip computer system.

5. A method for verifying inter-chip functionality in a multi-chip computer system having multiple integrated circuit chips, the method comprising:

defining a plurality of hardware models, wherein each hardware model is a relatively low-level software characterization of a corresponding computer chip, wherein the hardware model is synthesized and processed to form the corresponding computer chip;

defining a plurality of hardware emulators, wherein each hardware emulator is a relatively high-level software characterization of a corresponding computer chip which is not capable of being synthesized and processed to form the corresponding computer chip;

constructing a multi-chip computer system model, wherein the multi-chip computer system model includes a combination of hardware models and hardware emulators;

simulating the multi-chip computer system model with a simulator, wherein the simulator generates a plurality of events during execution, including inter-chip events, wherein inter-chip events are defined as events that are caused by interactions among and between the hardware models and hardware emulators;

processing the plurality of events generated by simulator, wherein the plurality of events are written to an events log file; and parsing the events log file with an inter-chip event detector, wherein the inter-chip event detector filters out inter-chip events caused by the hardware emulators and logs inter-chip events caused by the hardware models.

6. The method of claim 5, wherein the hardware models execute relatively slowly during the verification process, and the hardware emulators execute relatively quickly during the verification process.

7. The method of claim 5, wherein the simulator is a hardware description language (HDL) simulator.

8. The method of claim 5, wherein the inter-chip event detector accepts as input a file including a topology of the hardware models and hardware emulators that exist within the multi-chip computer system.

9. A computer readable medium containing instructions for controlling a computer system to perform a method comprising the steps of:

defining a plurality of hardware models, wherein each hardware model is a relatively low-level software characterization of a corresponding computer chip, wherein the hardware model is synthesized and processed to form the corresponding computer chip;

defining a plurality of hardware emulators, wherein each hardware emulator is a relatively high-level software characterization of a corresponding computer chip which is not capable of being synthesized and processed to form the corresponding computer chip;

constructing a multi-chip computer system model, wherein the multi-chip computer system model includes a combination of hardware models and hardware emulators;

simulating the multi-chip computer system model with a simulator, wherein the simulator generates a plurality of events during execution, including inter-chip events, wherein inter-chip events are defined as events that are caused by interactions among and between the hardware models and hardware emulators;

processing the plurality of events generated by simulator, wherein the plurality of events are written to an events log file; and parsing the events log file with an inter-chip event detector, wherein the inter-chip event detector filters out inter-chip events caused by the hardware emulators and logs inter-chip events caused by the hardware models.

10. The computer readable medium of claim 9, wherein the hardware models execute relatively slowly during the verification process, and the hardware emulators execute relatively quickly during the verification process.

11. The computer readable medium of claim 9, wherein the simulator is a hardware description language (HDL) simulator.

12. The computer readable medium of claim 9, wherein the inter-chip event detector accepts as input a file including a topology of the hardware models and hardware emulators that exist within the multi-chip computer system.

* * * * *